(12) United States Patent
Mathew et al.

(10) Patent No.: US 7,098,502 B2
(45) Date of Patent: Aug. 29, 2006

(54) TRANSISTOR HAVING THREE ELECTRICALLY ISOLATED ELECTRODES AND METHOD OF FORMATION

(75) Inventors: Leo Mathew, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 237 days.

(21) Appl. No.: 10/705,317

(22) Filed: Nov. 10, 2003

(65) Prior Publication Data

US 2005/0098822 A1    May 12, 2005

(51) Int. Cl.
*H01L 27/108*  (2006.01)
*H01L 27/12*  (2006.01)
*H01L 21/00*  (2006.01)
*H01L 21/336*  (2006.01)

(52) U.S. Cl. .................. 257/308; 438/257; 438/157; 257/347

(58) Field of Classification Search ............... 257/315, 257/317, 390
See application file for complete search history.

(56) References Cited

U.S. PATENT DOCUMENTS

| | | | |
|---|---|---|---|
| 4,859,623 | A | 8/1989 | Busta |
| 5,689,127 | A | 11/1997 | Chu et al. |
| 5,804,848 | A | 9/1998 | Mukai |
| 5,915,176 | A * | 6/1999 | Lim .......................... 438/257 |
| 6,011,725 | A | 1/2000 | Eitan |
| 6,097,065 | A | 8/2000 | Forbes et al. |
| 6,150,687 | A | 11/2000 | Noble et al. |
| 6,300,182 | B1 | 10/2001 | Yu |
| 6,330,184 | B1 | 12/2001 | White et al. |
| 6,355,961 | B1 | 3/2002 | Forbes |
| 6,372,559 | B1 | 4/2002 | Crowder et al. |
| 6,396,108 | B1 | 5/2002 | Krivokapic et al. |
| 6,413,802 | B1 | 7/2002 | Hu et al. |
| 6,414,356 | B1 | 7/2002 | Forbes et al. |

(Continued)

FOREIGN PATENT DOCUMENTS

DE         101 25 967 C1       5/2001

(Continued)

OTHER PUBLICATIONS

Singer, Pete; "Dual Gate Control Provides Threshold Voltage Options"; Semiconductor International; Nov. 1, 2003; 2pp: URL http://www.reed-electronics.com/semiconductor/index.asp?layout=article&articleId=CA331000&text=motorola&rid=0&rme=0&cfd=1.

(Continued)

*Primary Examiner*—Zandra V. Smith
*Assistant Examiner*—Kiesha Rose
(74) *Attorney, Agent, or Firm*—Robert L. King; David G. Dolezal

(57) ABSTRACT

A transistor (10) is formed having three separately controllable gates (44, 42, 18). The three gate regions may be electrically biased differently and the gate regions may have different conductivity properties. The dielectrics on the channel sidewall may be different than the dielectrics on the top of the channel. Electrical contacts to source, drain and the three gates is selectively made. By including charge storage layers, such as nanoclusters, adjacent the transistor channel and controlling the charge storage layers via the three gate regions, both volatile and non-volatile memory cells are realized using the same process to create a universal memory process. When implemented as a volatile cell, the height of the transistor and the characteristics of channel sidewall dielectrics control the memory retention characteristics. When implemented as a nonvolatile cell, the width of the transistor and the characteristics of the overlying channel dielectrics control the memory retention characteristics.

37 Claims, 7 Drawing Sheets

U.S. PATENT DOCUMENTS

| | | | |
|---|---|---|---|
| 6,424,001 | B1 | 7/2002 | Forbes et al. |
| 6,433,609 | B1 | 8/2002 | Voldman |
| 6,458,662 | B1 | 10/2002 | Yu |
| 6,472,258 | B1 | 10/2002 | Adkisson et al. |
| 6,531,350 | B1 | 3/2003 | Satoh et al. |
| 6,566,682 | B1 | 5/2003 | Forbes |
| 6,580,124 | B1* | 6/2003 | Cleeves et al. .............. 257/331 |
| 6,583,469 | B1 | 6/2003 | Fried et al. |
| 6,689,650 | B1 | 2/2004 | Gambino et al. |
| 6,703,282 | B1* | 3/2004 | Yang et al. .................. 438/306 |
| 6,720,216 | B1 | 4/2004 | Forbes |
| 6,768,158 | B1* | 7/2004 | Lee et al. .................... 257/315 |
| 6,816,414 | B1* | 11/2004 | Prinz ...................... 365/185.29 |
| 6,846,734 | B1 | 1/2005 | Amos et al. |
| 2003/0113970 | A1 | 6/2003 | Fried et al. |
| 2003/0178670 | A1 | 9/2003 | Fried et al. |
| 2005/0112817 | A1* | 5/2005 | Cheng et al. ............... 438/219 |

FOREIGN PATENT DOCUMENTS

WO    WO 00/21118    4/2000

OTHER PUBLICATIONS

Related Application 10/074,732 entitled "Method of Forming a Vertical Double Gate Semiconductor Device and Structure Thereof" filed Sep. 3, 2002 entitled.

Related Application 10/443,375, entitled "Transistor With Independent Gate Structures" filed May 22, 2003.

Related Application 10/443,908 "Memory with Charge Storage Locations" entitled May 22, 2003.

Related Application 10/427,141 entitled "Semiconductor Fabrication Process with Asymmetrical Conductive Spacers" filed Apr. 30, 2003.

Lee et al.; "Multilevel Vertical-Channel SONOS Nonvolatile Memory on SOI", IEEE Electron Device Letters, 2002; pp. 1-3 and 208-209.

Yu, Bin et al.; FinFET Scaling to 10nm Gate Length;; IEEE IDEM 2002; pp. 251-254; IEEE.

Choi, Yang-Kyu et al.; "Sub-20nm CMOS FinFET Technologies"; 2001 IEEE, 4 pp..

Kedzierski, Jakub et al.; "High-Performance Symmetric-Gate and CMOS-Compatible V1 Asymmetric-Gate FinFET Devices"; 2001; IEEE; 4 pp.

Kim, Keunwoo et al.; "Double-Gate CMOS Symmetrical—Versus Asymmetrical-Gate Devices"; IEEE Transactions On Electron Devices, vol. 48, No. 2; Feb. 2001; pp. 294-299.

Fossum, Jerry G. et al.; "Extraordinarily High Drive currents in Asymmetrical Double-Gate MOSFETS"; Superlattices and Microstructures, vol. 28, No. 5/6, 2000, 2000 Academic Press, pp. 525-530.

Hisamoto, Digh et al.; "FinFET—A Self-Aligned Double-Gate MOSFET Scalable to 20 nm"; IEEE Transactions on Electron Devices; vol. 47, No. 12, Dec. 2000, pp. 2320-2325.

Tanaka, Tetsu et al; Ultrafast Operation of $V_{th}$-Adjusted$^P$ Double Gate SOI MOSFET's; IEEE Electron Device Letters, vol. 15, No. 10, Oct. 1994; pp. 386-388.

Chan et al.; "A True Single-Transistor Oxide-Nitride-Oxide EEPROM Device"; IEEE Electron Device Letters; Mar. 1987; pp. 93-95; vol. EDL-8, No. 3.

Gonzalez, Fernando Sr. et al.; "A Dynamic Source-Drain Extension (DSDE) MOSFET Using a Separately Biased Conductive Spacer"; pp. 645-648.

\* cited by examiner

TRANSISTOR HAVING THREE ELECTRICALLY ISOLATED ELECTRODES AND METHOD OF FORMATION

CROSS REFERENCE TO RELATED APPLICATIONS

This application is related to the following U.S. patent applications:
(1) U.S. Ser. No. 10/074,732 entitled "Method of Forming A Vertical Double Gate Semiconductor Device and Structure Thereof" assigned to the assignee hereof;
(2) U.S. Ser. No. 10/443,375 entitled "Transistor With Independent Gate Structures" assigned to the assignee hereof; and
(3) U.S. Ser. No. 10/443,908 entitled "Memory With Charge Storage Locations" assigned to the assignee hereof.
(4) U.S. Ser. No. 10/427,141 entitled "Semiconductor Fabrication Process With Asymmetrical Conductive Spacers" assigned to the assignee hereof.

FIELD OF THE INVENTION

This invention relates to semiconductors, and more particularly to transistors for use in memories.

RELATED ART

As transistor geometries have dramatically been reduced to sub-micron dimensions, transistor structures have been forced to be altered due to the impact on the device physics that the smaller dimensions have created. In particular, the channel of a transistor has become extremely narrow. Due to the small length of the channel, the drain electrode of a transistor begins to negatively control the current conduction within the channel rather than the gate electrode being the controlling mechanism. This problem is well documented and is commonly referred to as a short channel effect. To reduce the problem of short channel effect, others have proposed a transistor structure wherein a gate electrode is positioned on opposite sides of the channel. While this approach dramatically reduces the short channel effect problem, the ability to mass manufacture such a structure is problematic because properly aligning the oppositely positioned gates is very difficult to implement for mass production. As an alternative, a transistor structure having a vertical silicon channel that is surrounded by the gate electrode has been proposed to reduce short channel effects. Such transistors are referred to by several different names including FINFETs and double-gated transistors. While some implementations of FINFET transistors have a single gate electrode, other implementations have used two electrically isolated gate electrodes for improved performance including control of the transistor's threshold voltage. In order to electrically isolate the two gate electrodes that are around the channel, a chemical mechanical polish (CMP) or polishing step has been used. Due to the narrow fin structure of these transistors, the polishing step tends to cause uneven polishing or "dishing" of the transistor device.

Reduced transistor structures have also brought about the ability to integrate both non-volatile (e.g. read-only-memory and Flash) and volatile (DRAM and SRAM) memory arrays for system on chip (SOC) applications. Typically different transistor structures implemented with differing processes are required to implement both non-volatile and volatile memory arrays. For example, a Flash memory transistor is implemented with a floating gate structure that is between a channel and a control gate. In contrast, a DRAM memory transistor is implemented with a planar transistor controlling a deep trench capacitor. The planar transistor uses a single plane channel that separates a source and a drain and that is controlled by an overlying gate. The requirement to implement both volatile and non-volatile memory arrays on a single integrated circuit therefore adds significant cost since differing processes and structures must be implemented. Additionally, due to the different transistor structures that are required, the operating characteristics of the transistors on a same integrated circuit may significantly differ.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
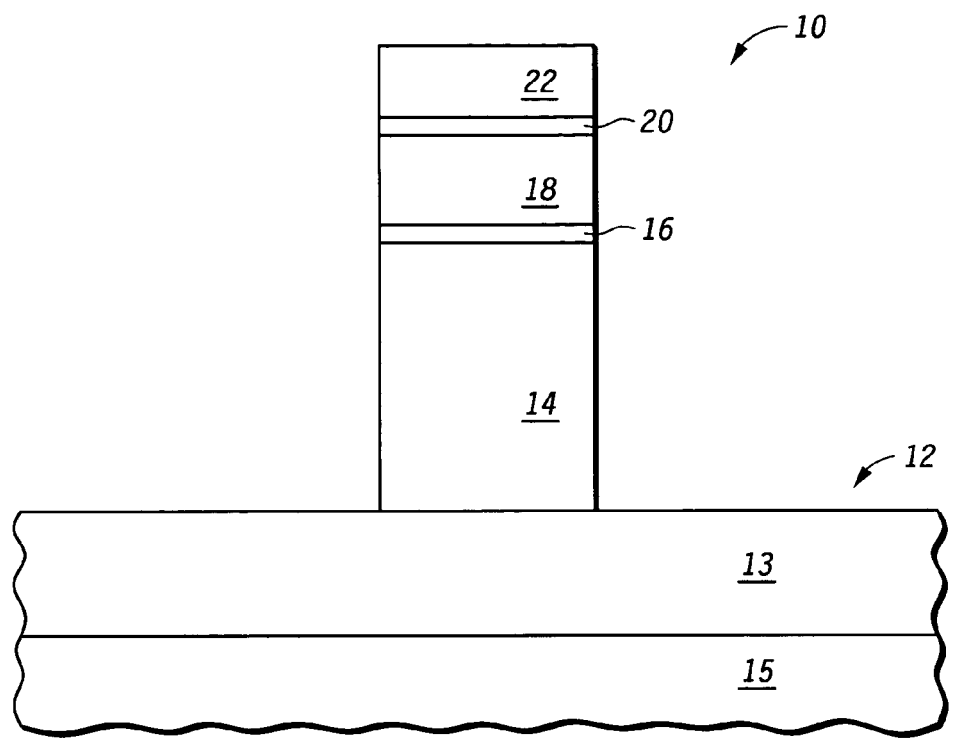
FIGS. 1–4 illustrate in cross-sectional form a field effect transistor in accordance with a first form of the present invention.

Illustrated in FIG. 1 is a cross-sectional view of a semiconductor wafer 12 during a stage in the manufacture of a field effect transistor 10 with three electrically isolated gate structures. Semiconductor wafer 12 includes a substrate 15 that is implemented with any of a variety of semiconductor materials, such as an SOI wafer, or with any mechanical substrate, such as a glass or sapphire substrate. Overlying the substrate 15 is an insulating layer 13. Insulating layer 13 may be implemented with any oxide or any nitride or sapphire. Overlying insulating layer 13 is a patterned fin semiconductor structure that forms a channel 14 of a FinFET (Fin Field Effect Transistor) that is silicon (either polysilicon, crystalline silicon, amorphous silicon, SiGe, germanium or a combination of any of these). Overlying the channel 14 is an oxide 16. Overlying the oxide 16 is a third gate 18 (the first and second gates to be identified below). In one form the third gate 18 is polysilicon. In another form, the third gate 18 may be a doped material using a conventional implant process. Overlying the third gate 18 is an oxide layer 20. In one form the oxide 20 is silicon dioxide. Overlying the oxide layer 20 is a nitride layer 22. In one form nitride layer 22 is silicon nitride. To form the illustrated structure of field effect transistor 10, each of channel 14, oxide 16, the third gate 18, oxide layer 20 and nitride layer 22 is formed by thermal growth of layers of the indicated material or deposition of the layers. The layers are conventionally patterned by etching the layers to create the structure of field effect transistor 10. Channel 14, oxide 16, the third gate 18 and nitride layer 22 have resulting exposed sidewalls.

Figure 2:
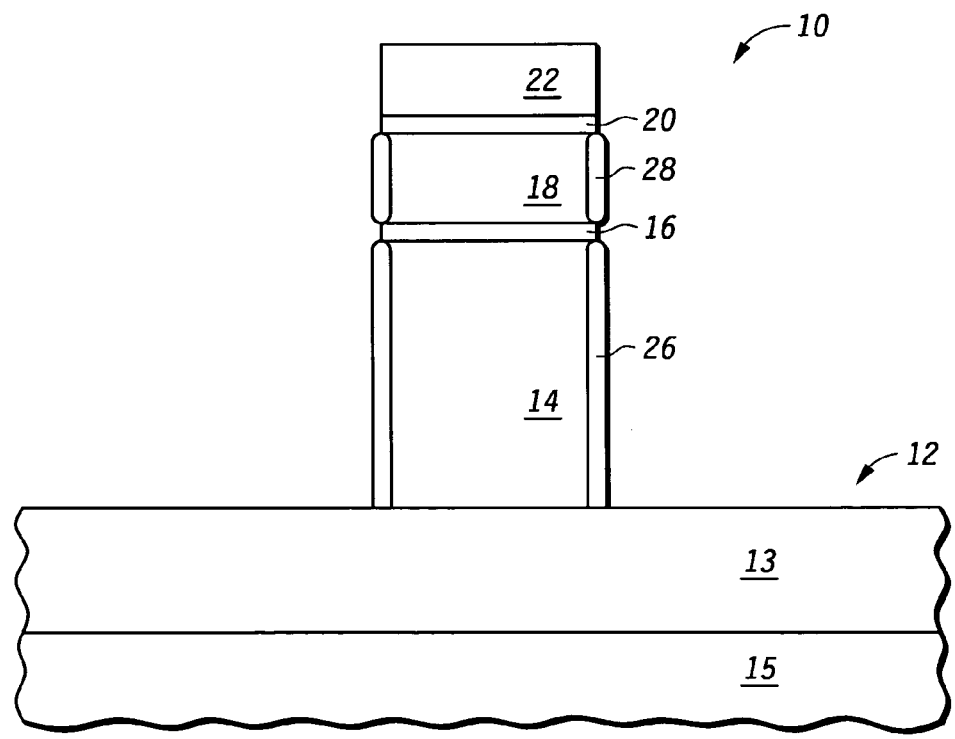

Illustrated in FIG. 2 is further processing of field effect transistor 10 of FIG. 1. A conventional sacrificial oxide clean step is performed after the etching. Channel 14 has sidewalls that are illustrated in cross-sectional form in FIG. 2 as being opposing. An oxide layer 26 is formed on the sidewalls of channel 14 (first and second sidewalls in FIG. 2 that are on opposite sides of channel 14), and an oxide layer 28 is formed on the sidewall of the third gate 18. It should be understood that oxide layer 26 is actually a continuous layer of material around channel 14 and thus different reference numbers are not assigned to the left side and the right side. The oxide layer 26 and the oxide layer 28 may be either thermally grown or deposited in a conventional manner. The oxide layer 26 is provided to function as a gate dielectric and oxide layer 28 is provided to function as isolation for the third gate 18 from contact with other surfaces. It should be understood that other materials are suitable for use as oxide layer 26 and oxide layer 28. For example, oxynitride or any high permittivity material such as, for example hafnium oxide, or a combination of these materials may be used as the material for each of oxide layer 26 and oxide layer 28.

Figure 3:
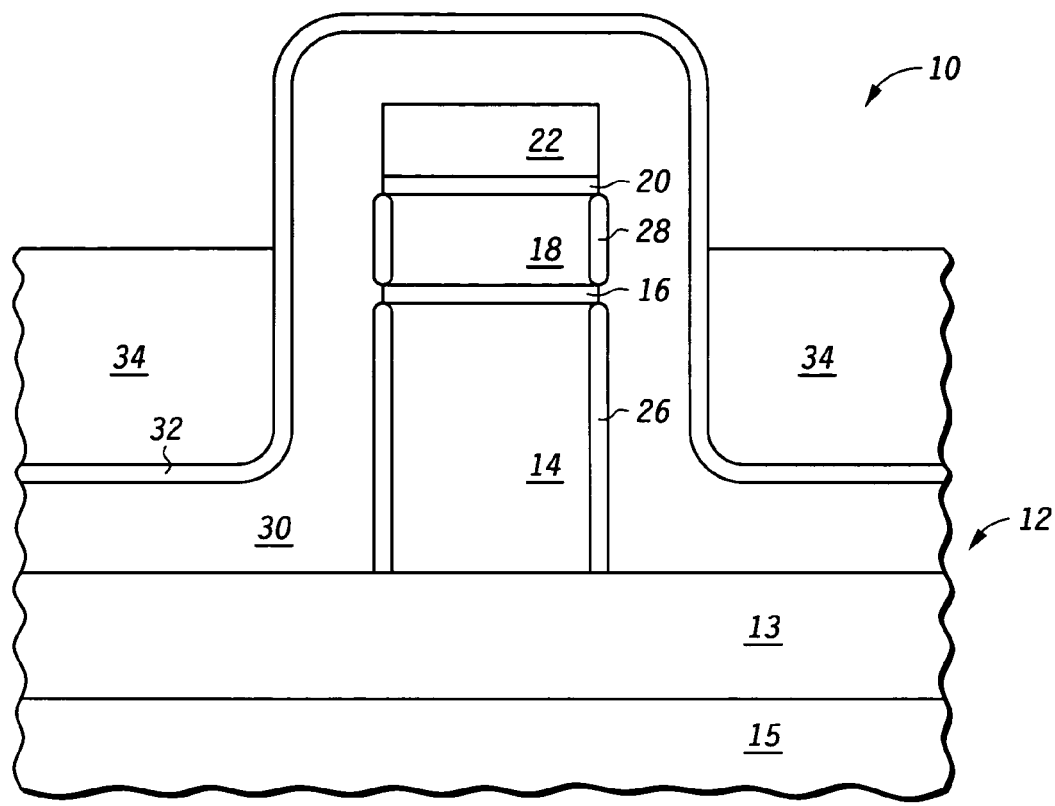

Illustrated in FIG. 3 is further processing of field effect transistor 10 of FIG. 2. A conformal polysilicon layer 30 is formed around the existing structure. In one form, polysilicon layer 30 is deposited. An optional implant of the polysilicon layer 30 may be implemented. The optional implanting may take one of several forms. The implanting may be multiple implants of same or different species (i.e. N-type and P-type), such as boron, phosphorous or arsenic, etc. The dose, direction and energy of the implanted species may be varied to define conductivity of regions within polysilicon layer 30 to the left and to the right of channel 14. If the doping type of polysilicon layer 30 is different than the doping of the first gate 18, this allows for the channel threshold voltage to be controlled as in an asymmetric double gate transistor. In other forms polysilicon layer 30 may be implemented with other materials such as silicon germanium, titanium nitride, tantalum silicon nitride or silicides or combinations of these. Overlying the polysilicon layer 30 is an antireflective coating (ARC) layer 32. In one form ARC layer 32 is a nitride. It should be understood that ARC layer 32 is an optional layer. The ARC layer 32 is conformal to the existing structure and is deposited. A spin-on resist layer 34 is deposited onto the field effect transistor 10 to a height which is initially greater than the height of the upper surface of nitride layer 22 and then etched back to expose a portion of the ARC layer 32. The etch may be either an isotropic or an anisotropic etch. The spin-on resist layer 34 exposes the nitride ARC layer 32 overlying the fin region of the FinFET and covers the other portions of the ARC layer 32. Other spin-on materials such as spin-on glass may be used for spin-on resist layer 34. Alternatively, the spin-on resist layer 34 may be formed at a desired height using conventional spin-on or deposition techniques.

Figure 4:
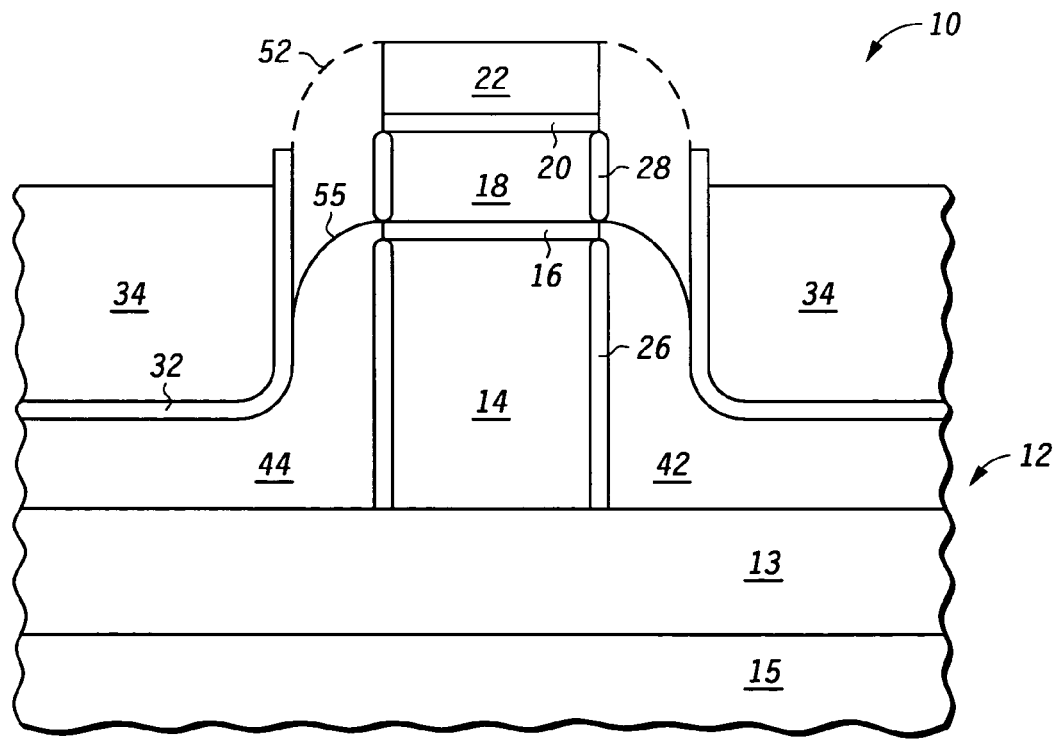

Illustrated in FIG. 4 is further processing of field effect transistor 10 of FIG. 3. In FIG. 4 field effect transistor 10 has been etched to remove an exposed portion of the ARC layer 32 and a portion of the polysilicon layer 30. The etching results in the formation of a first gate 44 and a second gate 42. This etch may stop at various points. In another form, a CMP polish step is used and the polishing results in the upper surface of first gate 44 being at edge 52. When an etch is performed, the upper surface of first gate 44 and second gate 42 may be positioned at various locations, such as at either edge 52 or further down such as at an edge 55. The location of the upper surface of first gate 44 and second gate 42 determines how much capacitive coupling exists between the third gate 18 and each of the first gate 44 and second gate 42. Therefore, in some applications it is generally more desirable to stop the etch when the upper surface of the first gate 44 and the second gate 42 is below the lower surface of the third gate 18. In other applications it is desirable to have some amount of capacitive coupling between the third gate and each of the first gate and second gate. Therefore, the etching provides a significant degree of flexibility in the control of the size of the first gate 44 and the second gate 42. The spin-on resist layer 34 and the nitride ARC layer 32 are removed using a conventional wet etch step. Additionally, nitride ARC layer 22 may be removed by the conventional wet etch step. Further, it should be noted that when suitable materials are used for spin-on resist layer 34, and nitride for ARC layer 32 and nitride layer 22 for making electrical contacts thereto, these layers may be kept in place rather than being etched away. For example, if spin-on resist layer 34 is implemented as a spin-on dielectric, and each of the first gate, the second gate and the third gate are silicides are metals, spin-on resist layer 34, ARC layer 32 and nitride layer 22 need not be etched away.

Figure 5:
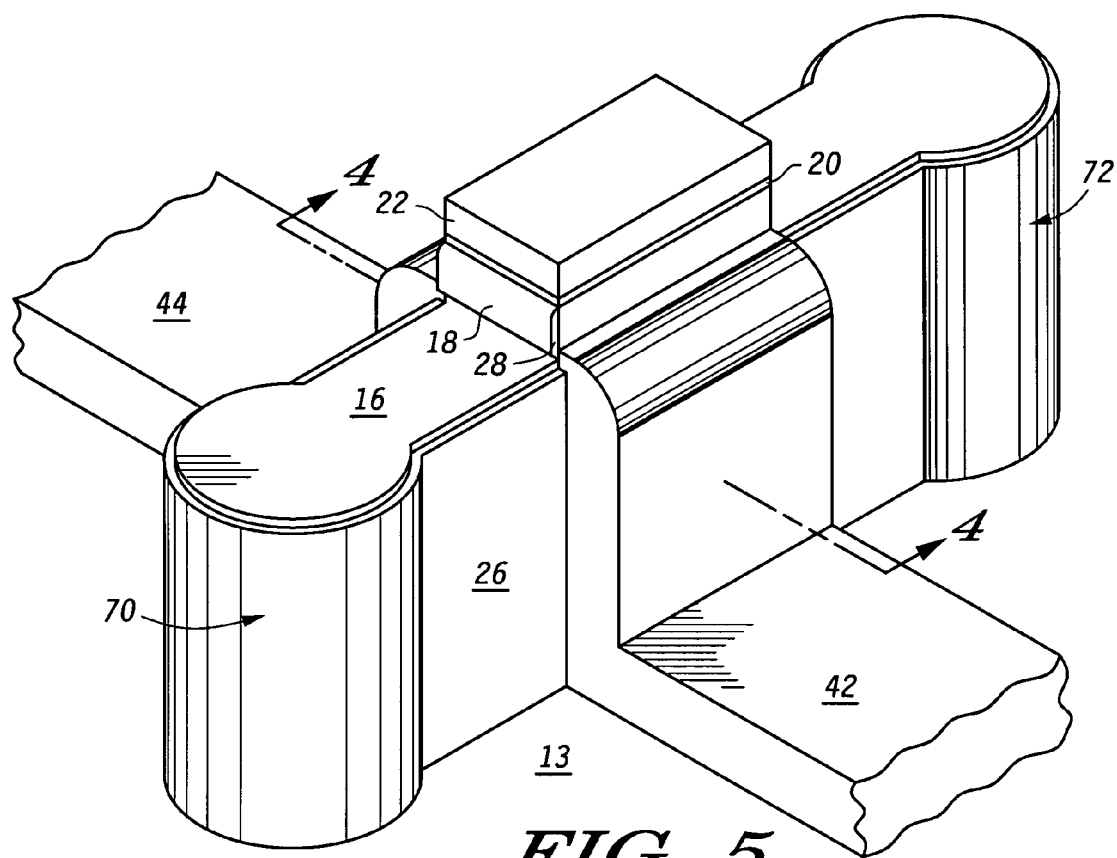
FIG. 5 illustrates in perspective form the field effect transistor of FIG. 4.

Illustrated in FIG. 5 is a perspective view of the field effect transistor 10 of FIG. 4. First gate 44, second gate 42, third gate 18, nitride layer 22 and oxide layer 20 have been lithographically patterned and etched using conventional photolithography. This patterning defines a gate length for each of first gate 44, second gate 42 and third gate 18 that is illustrated in FIG. 5. Using the photoresist as a mask, portions of the polysilicon layer 30, nitride layer 22, oxide layer 20 and third gate 18 are removed. Oxide layer 26 and gate oxide 16 function as an etch stop layer during the etching of this lithographic patterning. This processing exposes regions in which a source region 70 and a drain region 72 are formed by a conventional doping step such as an implant. Further additional processing may be implemented. For example, sidewall spacers (not shown) may be formed adjacent each of the first gate 44, the second gate 42 and the third gate 18. Also, silicidation of exposed silicon semiconductor surfaces may be implemented to reduce the resisitvity of the silicon surfaces. If so, then this silicidation will form a silicidation layer at an upper surface of exposed portions of first gate 44, second gate 42, third gate 18, source region 70 and drain region 72. It should be noted that the order of process steps described herein may be varied. For example, the etching (or alternative polishing) to form the first gate 44 and the second gate 42 may be implemented after the formation of the spacers (not shown) or the silicidation described above.

Figure 6:
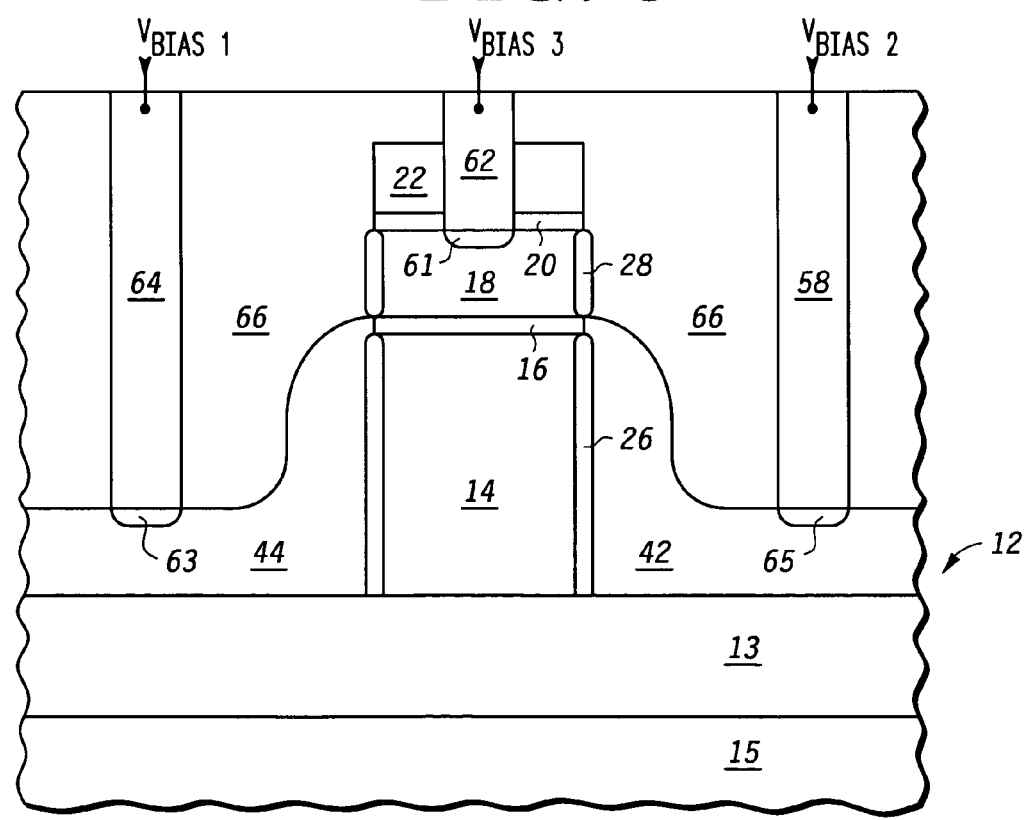
FIG. 6 illustrates in cross-sectional form the field effect transistor of FIG. 4 having electrical contacts.

Illustrated in FIG. 6 is further processing of field effect transistor 10 wherein an interlevel dielectric (ILD) 66 is formed by depositing a layer such as an oxide, a nitride, a low permittivity dielectric or a combination of these materials. Contact holes within the ILD 66 are lithographically defined and etched. The contact holes may be to all three of first gate 44, second gate 42 and third gate 18 or only to selected ones of these three gates. When the contact holes are formed, a metal contact 64 connects first gate 44 at a silicide region 63 created by the silicidation step described above. Similarly, a metal contact 58 connects the second gate 42 at a silicide region 65 and a metal contact 62 connects the third gate 18 at a silicide region 61. Any metal may be used for metal contacts 58, 62 and 64, such as tungsten or titanium nitride or others. Metal contact 64 is connected to a first bias voltage, $V_{BIAS\ 1}$. Metal contract 58 is connected to a second bias voltage, $V_{BIAS\ 2}$. Metal contact 62 is connected to a third bias voltage, $V_{BIAS\ 3}$. These three bias voltages may be the same voltage or may be different voltages or the same for only two of the bias voltages.

A transistor has been formed having three electrically isolate gate electrodes, first gate 44, second gate 42 and third gate 18. All three of these gates may independently control the channel 14. Each of the metal contacts 58, 62 and 64 may be separately biased with different voltage potentials to control characteristics such as threshold voltage, the "on" current and the "off" current. Additionally, the doping concentrations of each of these three electrically isolated gates may be varied by the doping concentrations chosen to implant into the first gate 44, second gate 42 and third gate 18. The doping concentration variation and type determines the threshold voltage characteristics of the field effect transistor 10.

Figure 7:
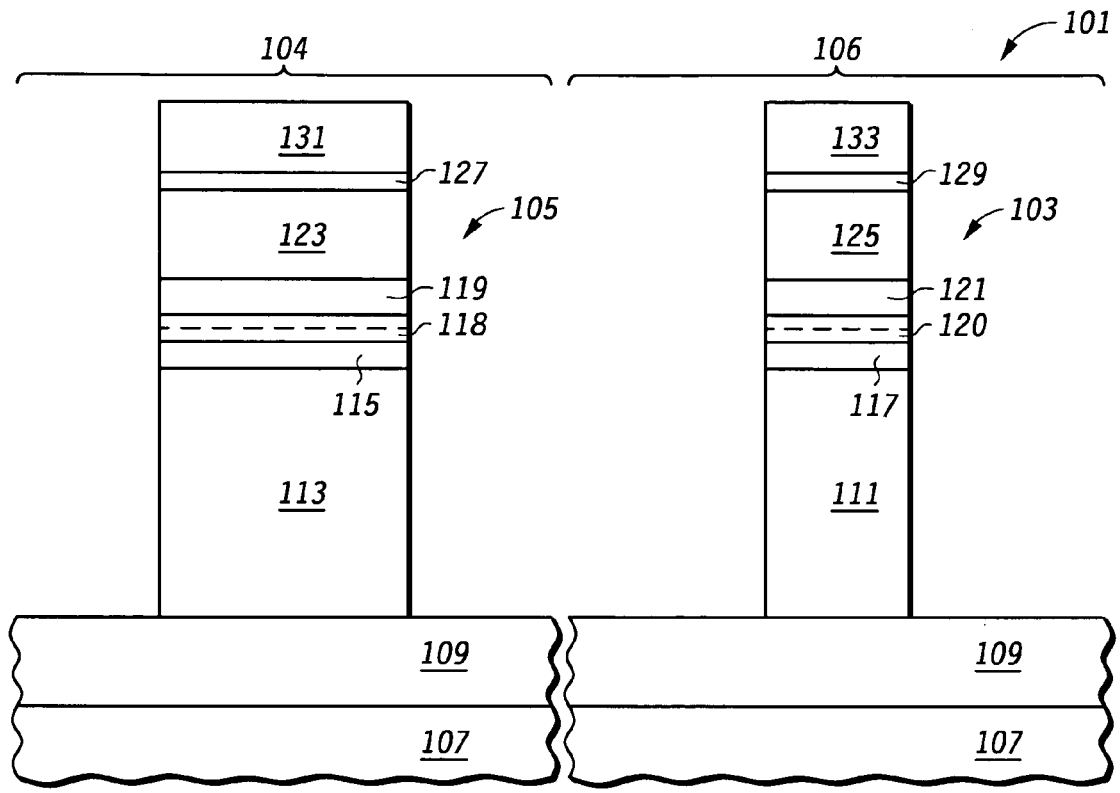
FIGS. 7–11 illustrates in cross-sectional form a memory application of a volatile memory transistor and a non-volatile memory transistor using a second form of the field effect transistor.

Illustrated in FIG. 7 is another form of field effect transistors having multiple electrically isolated gates that additionally have a memory storage capability. In particular, a nonvolatile region 104 and a volatile region 106 are provided on a wafer 101 and are respectively represented by a transistor 105 and a transistor 103. Photolithography and etch are used to define widths of transistors 105 and 103. Note that the width of the transistors in the nonvolatile region 104 is greater than the width of the transistors in the volatile region 106. Note also that the height of the transistor stacks forming transistors 105 and 103 are the same since they are formed from the same layers. In the illustrated form, nonvolatile region 104 and volatile region 106 are positioned in differing area of the wafer 101 as represented by the break between the two regions. A substrate 107 is provided with an overlying insulating layer 109. A channel 113 overlies the insulating layer 109. A charge storage structure is formed by an dielectric layer 115 overlying the channel 113, a charge storage layer 118 overlying the dielectric layer 115, and a control gate dielectric 119. In one form, each of dielectric layer 115 and control gate dielectric 119 is an oxide that is thermally grown. In another form the dielectric layer 115 is an oxynitride layer or a CVD-formed oxide. The charge storage layer 118 is formed by using a layer of nanoclusters. In one form the nanoclusters are implemented by silicon nanocrystals. In another form the nanoclusters are implemented by a layer of charge trapping nitride material. In yet another form, the nanoclusters are formed using a combination of these materials. Other charge storage materials may be used. Overlying the charge storage structure is a third gate 123 that is overlying the control gate dielectric 119. Overlying the control gate dielectric 119 is a pad oxide layer 127 and a nitride layer 131.

In the non-volatile region 106, a channel 111 overlies the insulating layer 109. A charge storage structure is formed by an dielectric layer 117 overlying the channel 111, a charge storage layer 120 overlying the dielectric layer 117, and a control gate dielectric 121. In one form, each of dielectric layer 117 and control gate dielectric 121 is an oxide that is thermally grown. In another form the dielectric layer 117 is an oxynitride layer or a CVD-formed oxide. The charge storage layer 120 is formed by using a layer of nanoclusters. In one form the nanoclusters are implemented by silicon nanocrystals. In another form the nanoclusters are implemented by a layer of charge trapping nitride material. In yet another form, the nanoclusters are formed using a combination of these materials. Other charge storage materials may be used. Overlying the charge storage structure is a third gate 125 that is overlying the control gate dielectric 121. Overlying the control gate dielectric 121 is a pad oxide layer 129 and a dielectric layer 133 that in one form is nitride.

Figure 8:
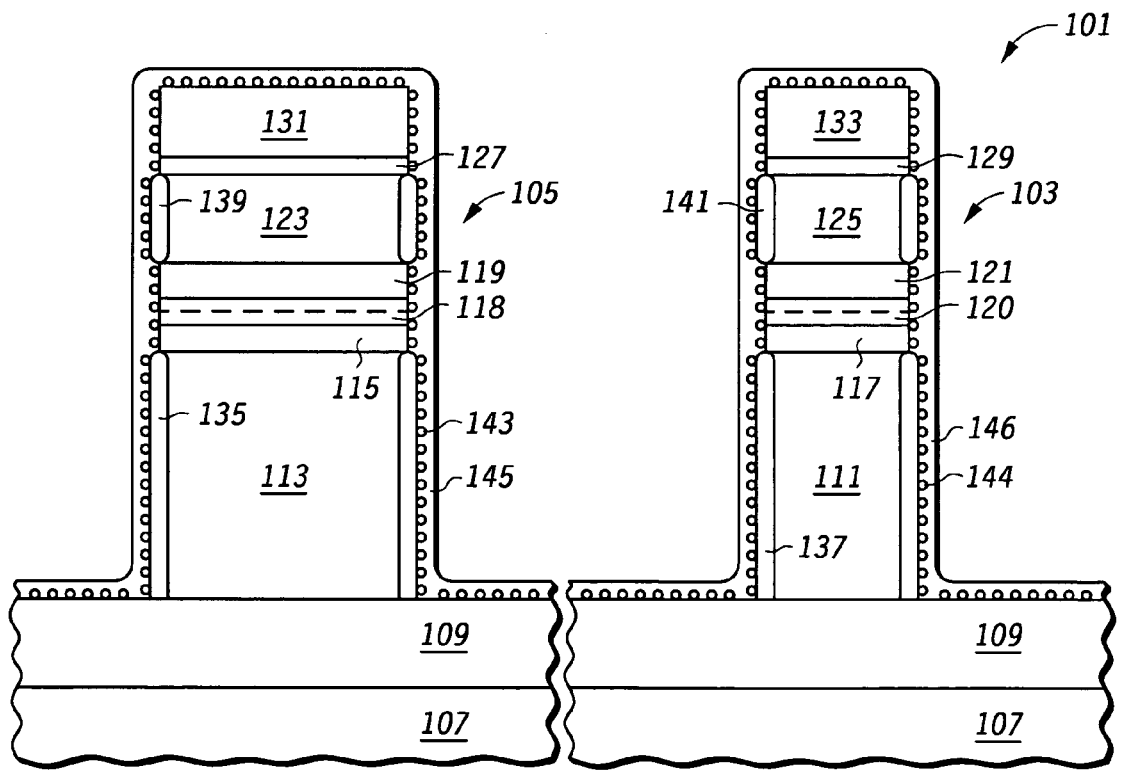

Illustrated in FIG. 8 is further processing of the field effect transistors of FIG. 7. A dielectric layer 135 and 139 is formed on sidewalls of channel 113 and third gate 123, respectively. Similarly, a dielectric layer 137 and a dielectric layer 141 is formed on sidewalls of channel 111 and first gate 125, respectively. A layer of nanoclusters 143 are formed over all exposed surfaces using conventional CVD methods. As mentioned above, the nanoclusters 143 may be any of a variety of different charge storage materials. Overlying the nanoclusters 143 is a dielectric layer 145. The dielectric layer 145 may be either deposited or grown and in one form is one of a nitride layer, an oxide layer or an oxynitride layer.

Figure 9:
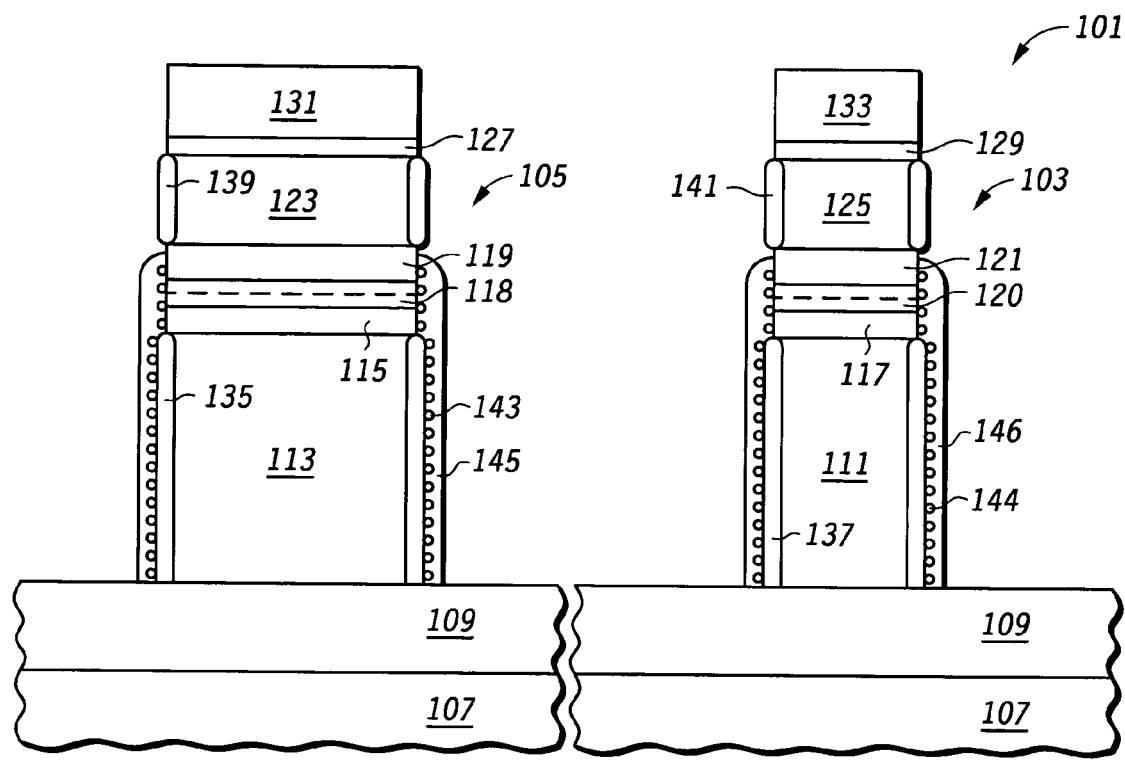

Illustrated in FIG. 9 is further processing of the field effect transistors of FIG. 7. An optional anisotropic etch is used to etch away regions of the nanoclusters 143 from exposed horizontal surfaces of the structure and partly in a vertical direction adjacent the edges of the transistor stacks. Although FIG. 9 illustrates that the nanoclusters 143 are etched along the sidewalls of the transistor stacks to a point below the third gates 123 and 125, the amount of nanoclusters that are etched from the sidewall may vary from any point along the sidewall of nitride layer 131 down to any point along the sidewall of channel 113. This etch creates separate dielectric layer 145 and dielectric layer 146 for transistors 105 and 103, respectively. Similarly, separate nanoclusters 143 and 144 are created for transistors 105 and 103, respectively. Additionally no etching of the nanoclusters 143 may occur and the processing of FIG. 9 is not implemented.

Figure 10:
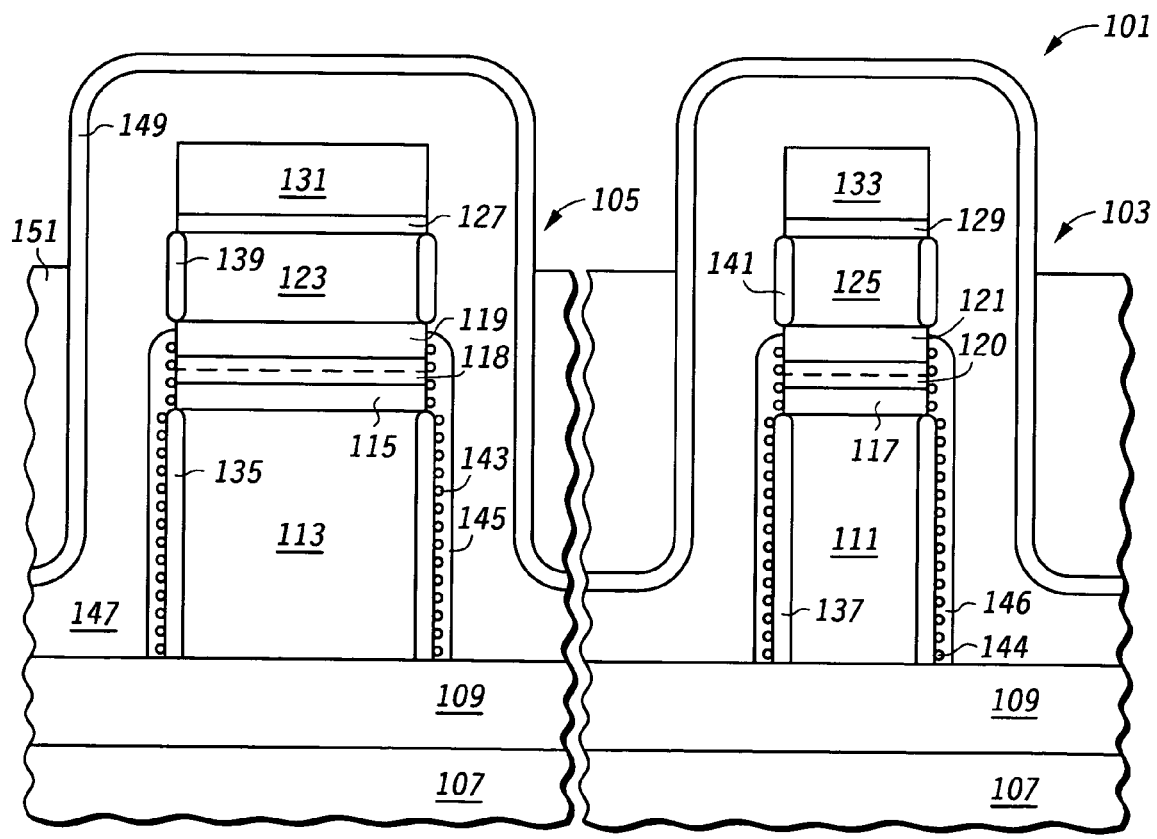

Illustrated in FIG. 10 is further processing of the transistors of FIG. 7. A conformal deposition of a gate layer 147 is made over transistor 105 and 103. The gate layer 147 may be polysilicon, silicon germanium, metal or a combination thereof. Overlying the gate layer 147 is a nitride layer 149. Other dielectrics may be used in lieu of nitride. The nitride layer 149 functions as an ARC layer. At this point, photolithography may be used to define predetermined regions of gate material on wafer 101 where the first gate, second gate and third gate will subsequently be positioned. At this point, in the regions where there is no gate patterning protecting the nitride layer 149, removal of nitride layer 149, gate layer 147, nitride layer 131, oxide layer 127, third gate 123 and the charge storage structure (control gate dielectric 119, charge storage layer 118 and dielectric layer 115) may be performed. A spin-on resist layer 151 is deposited onto the field effect transistors 105 and 103 to a height which is initially greater than the height of the upper surface of nitride layer 149 and then etched back to expose a portion of the nitride layer 149. The etch may be either an isotropic or an anisotropic etch. The spin-on resist layer 151 exposes the nitride layer 149 overlying the fin region of the FinFET and covers the other portions of the nitride layer 149. Other spin-on materials such as spin-on glass may be used for spin-on resist layer 151.

Figure 11:
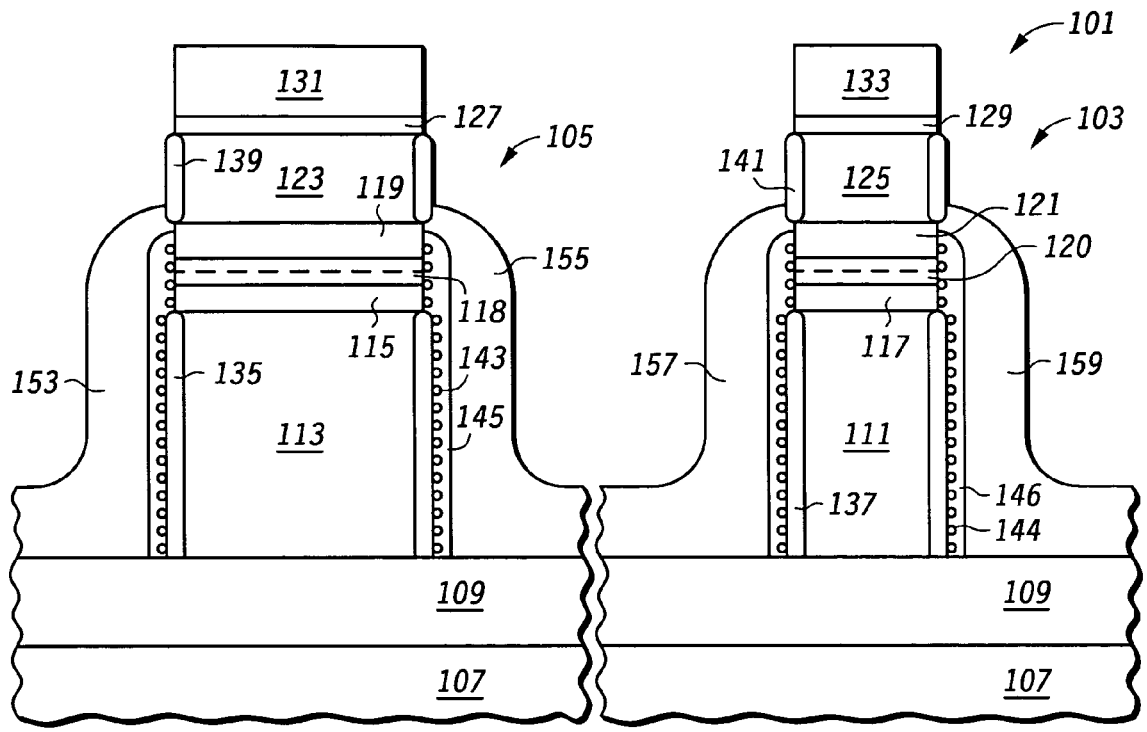

In FIG. 11, field effect transistors 105 and 103 are etched to remove an exposed portion of the nitride layer 149 and a portion of the gate layer 147. The etching results in the formation of a first gate 153 and a second gate 155 for transistor 105, and in the formation of a first gate 157 and a second gate 159 for transistor 103. Again, this etch step may stop at various points other than at the specific point illustrated in FIG. 11. The remainder of the spin-on resist layer 151 and nitride layer 149 is removed in a conventional manner. However, it should be noted that the spin-on resist layer 151, nitride layer 149 and nitride layer 131 may be left in place if suitable materials, such as spin-on glass, is used for the spin-on resist layer 151. In another form, the nitride layer 131 may be removed with the same step that removes nitride layer 149. Because transistor 105 of nonvolatile region 104 has the same vertical dimensions as transistor 103 of volatile region 106, the profiles of transistor 105 and transistor 103 are the same except for the difference in width of the gates as previously mentioned.

Figure 12:
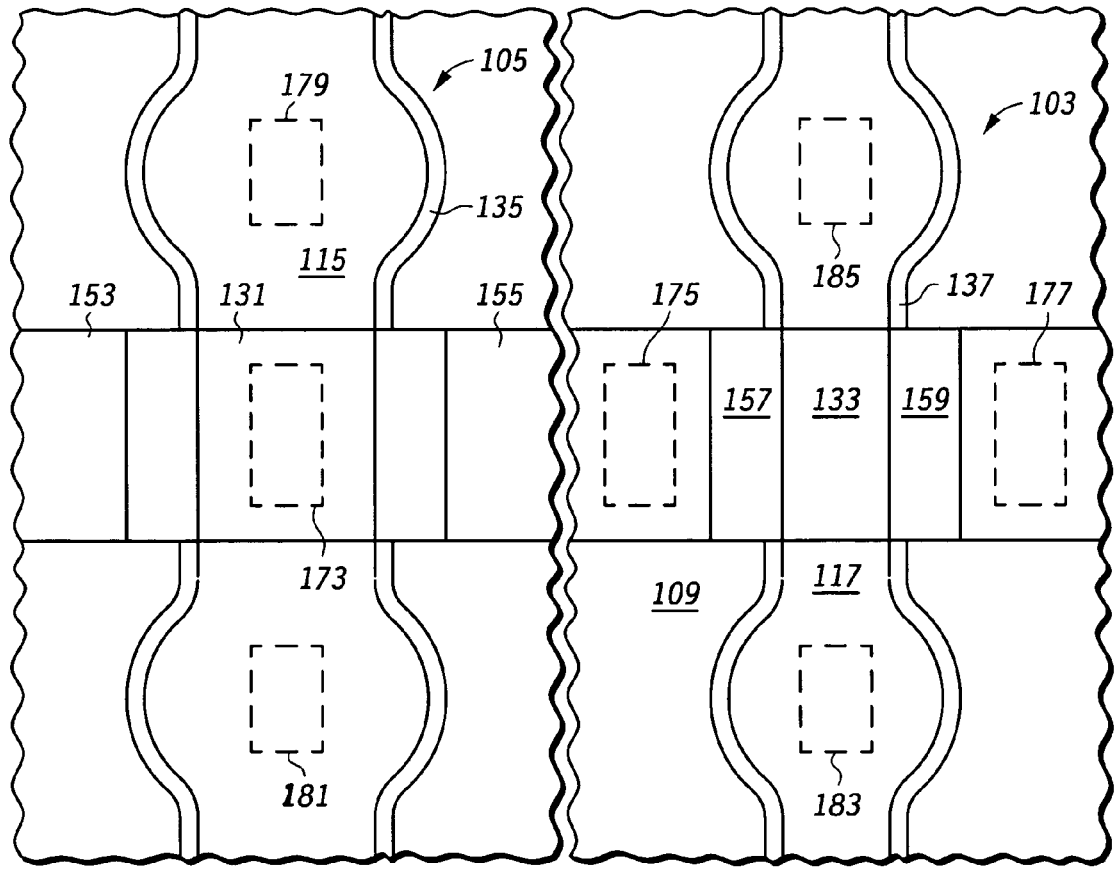
FIG. 12 illustrates in top plan form the volatile memory transistor and the non-volatile memory transistor of FIG. 11.

Illustrated in FIG. 12 is a top plan view of each of transistor 103 and transistor 105 in the present state represented in FIG. 11. A gate contact region 173 overlies the nitride layer 131 of transistor 105. Gate contact region 175 and gate contact region 177 respectively overlie first gate 157 and second gate 159 of transistor 103. Source contact region 179 overlies a source diffusion region of transistor 105, and drain contact region 181 overlies a drain diffusion region of transistor 105. Similarly, a source contact region 185 overlies a source diffusion region of transistor 103, and a drain contact region 183 overlies a drain diffusion region of transistor 103. As can be seen from the top view, the width of the channel of transistor 103 of volatile region 106 is typically less than the width of the channel of transistor 105 of nonvolatile region 104 but does not necessarily have to be less. The width of transistor 105 which forms a nonvolatile storage transistor is defined mainly by the amount of area needed to make an electrical contact to the third gate 123. The width of transistor 105 is also dependent upon the amount of charge storage area needed within charge storage layer 118 to make transistor 105 be non-volatile. In other words, the width of transistor 105 needs to be large enough to make charge storage layer 118 retain its charge when a bias voltage is removed from the third gate 123. In contrast, transistor 103 may have a narrower width because the storage characteristics are defined by the charge storage elements 144 in the sidewalls of the channel 111 rather than the width of charge storage layer 120. Additionally electrical contact to transistor 103 does not need to be made at the top third gate 125. Therefore, the height of transistor 103 and the electrical characteristics of dielectric layer 137 and dielectric layer 146 controls the memory retention characteristics of transistor 103, whereas the width of transistor 105 and the electrical characteristics of the control gate dielectric 119 and dielectric layer 115 control the memory retention characteristics of transistor 105. There could optionally be additional contacts (not shown) to each of the first gate 153, the second gate 155 and the third gate 123. Such contacts could be used to implement additional biasing of the channels 113 and 114, the layer of nanoclusters of charge storage layer 143 and the layer of nanoclusters of charge storage elements 144 or charge storage layer 118 and charge storage layer 120.

Figure 13:
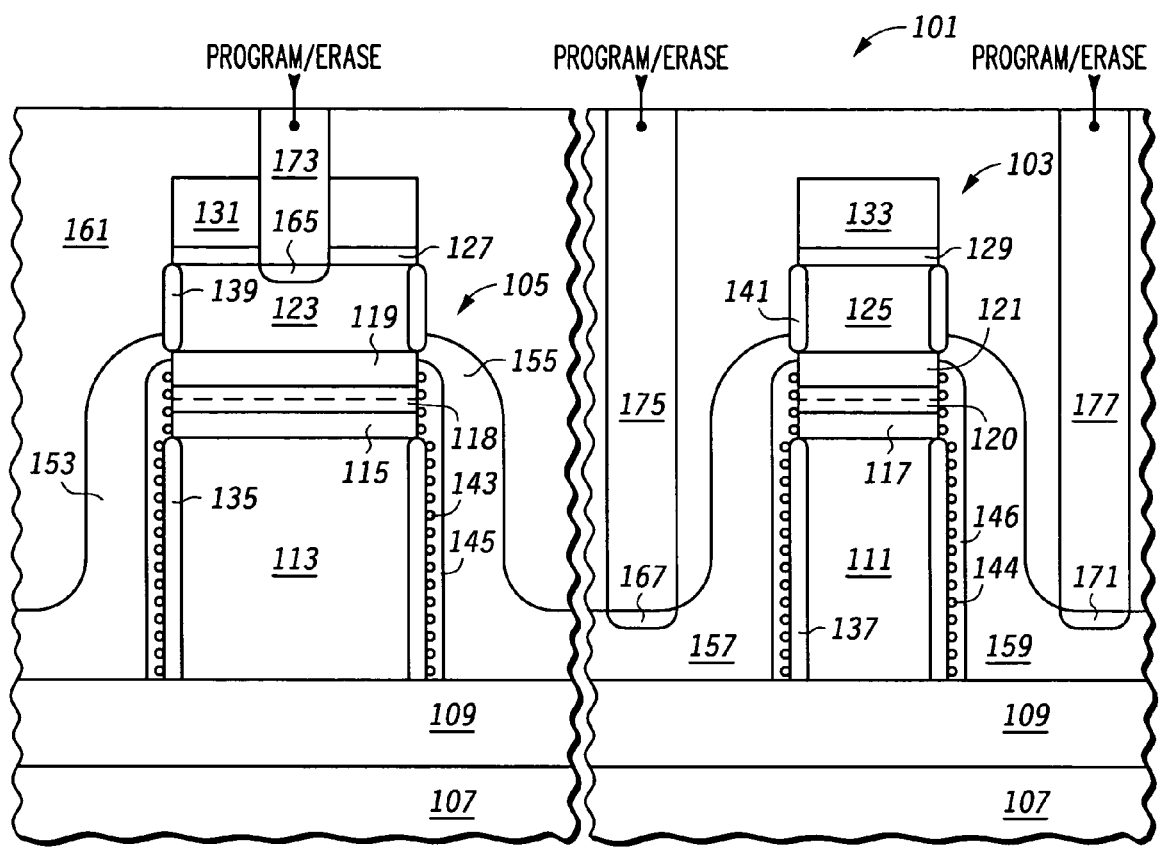
FIG. 13 illustrates in cross-sectional form the volatile memory transistor and the non-volatile memory transistor of FIG. 11 having electrical contacts.

Illustrated in FIG. 13 is a cross-sectional view of transistors 105 and 103 where silicided contact vias have been formed to predetermined gates of the transistors. A single gate contact is made to each transistor in the nonvolatile region 104. The gate that is contacted for each transistor in the nonvolatile region 104 is the overlying or top gate that overlies the channel. Two gate contacts are made to each transistor in the volatile region 106. The gates that are contacted for each transistor in the volatile region 106 are adjacent the sidewalls of the transistor. Where contact is made by contacts 173, 175 and 177, underlying suicide regions 165, 167 and 171 are respectively formed. By program (i.e. writing) biasing each transistor in the nonvolatile region 104 with a single voltage to the gate overlying the channel and making the channel wide enough to maintain the charge in the layer of nanoclusters 143, transistor 105 functions as a nonvolatile memory storage element. Similarly, when transistor 103 is biased at both of the gates that are adjacent the sidewalls of the channel 111, the layer of nanoclusters 144 of transistor 103 is charged and remains charged while power is refreshed or maintained at either first gate 157 or second gate 159.

Figure 14:
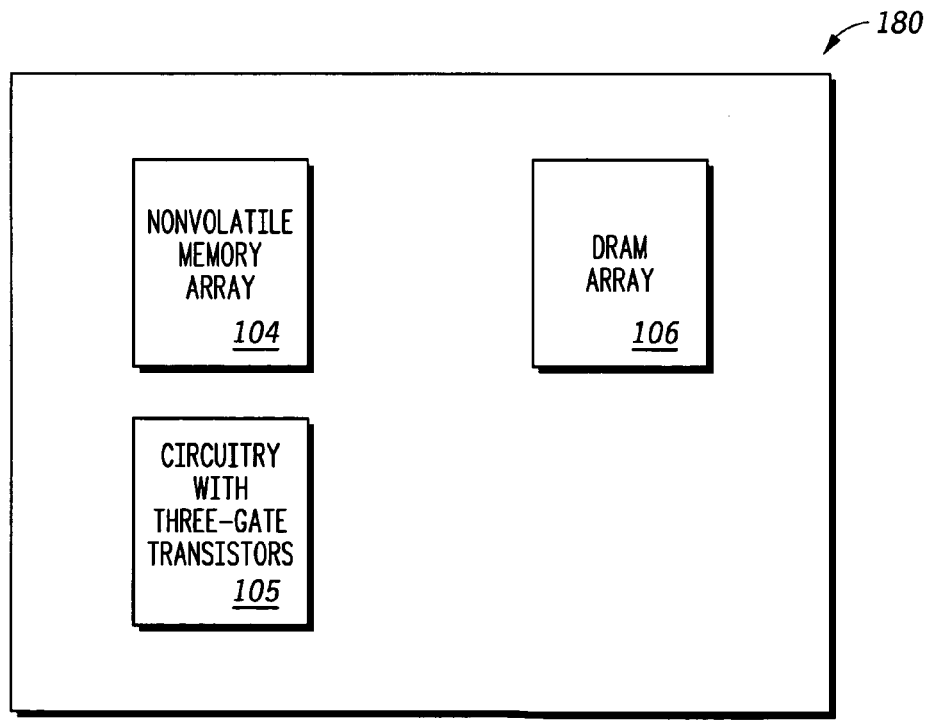
FIG. 14 illustrates a plan view of an integrated circuit implementing differing types of memory arrays by using the volatile memory transistor and the non-volatile memory transistor of FIG. 11.

Illustrated in FIG. 14 is an integrated circuit 180 having two differing types of memories that are implemented using the same processing to implement transistors like transistor 105 in a nonvolatile region 104, transistors like transistor 10 as embodied in FIGS. 1–6 in a region 105 having circuitry with three-gate transistors, and transistors like transistor 103 in a volatile region 106. While a dynamic memory such as a DRAM is identified as the type of storage device for the volatile region 106, other types of volatile memory arrays may be implemented such as a FLASH memory array. Any type of circuit, including logic, analog and digital circuits may be implemented in region 105 using the three-gate transistors. Any other of various circuit modules (not shown) may be included within integrated circuit 180 that use one or all three types (NVM three-gate transistors, volatile memory three-gate transistors and non-memory three-gate transistor structures) of transistor functions described herein. It should be apparent that an integrated circuit may be implemented that uses only one or two of the three circuit categories identified in FIG. 14.

By now it should be appreciated that there has been provided a transistor structure having three independent gates. In one form, this transistor can be configured to provide a universal memory architecture wherein both non-volatile and volatile memory cells may be implemented on a same integrated circuit using a same semiconductor process. The versatility of the transistor structure described herein significantly reduces the cost associated with manufacturing memories such as Flash or DRAM with ROM or SRAM on a same chip. Conventionally, different memory modules made using different processing steps are required to be implemented on the integrated circuit. By having three independent gates, the transistor functions to provide three distinct sources of channel electrical modulation. With the increased channel current control, the threshold voltage of the transistor can be more accurately controlled (i.e. the threshold voltage can be dynamically raised or lowered by varying the biasing of the combination of the gates). The transistor threshold voltage may also be set depending upon the size and type of gate dielectrics used to interface the channel with the three gates and depending upon the size and doping of the gates and the material composition of the gates. The third gate may be doped by conventional implantation or in-situ doping. The first and second gates may be implanted with angled implants of the same or differing species. The first and second gates may also be insitu doped to obtain the same conductivity.

By using one type of memory storage matter for charge storage layer 118 and a different type of memory storage matter for charge storage layer 143, different read and write memory mechanisms may be created. In particular, transistor 105 may be programmed (i.e. written) by using hot carrier injection (HCI) by using the overlying third gate and erased by tunneling or hot hole carriers by carrier conduction between the source and drain. Transistor 103 may be programmed by using tunneling or warm channel programming using the first gate 157 and the second gate 159. Transistor 103 may be erased by using tunneling from any of the three gates or by biasing the source drains appropriately.

In the foregoing specification, the invention has been described with reference to specific embodiments. However, one of ordinary skill in the art appreciates that various modifications and changes can be made without departing from the scope of the present invention as set forth in the claims below. For example, the channel 14 and third gate 18 that are below the nitride layer 22 may be recessed at the sidewall edges after the etch and clean steps described above. After forming charge storage layer 143 in FIG. 8, a portion of the wafer 101 may be masked and charge storage layer 143 and dielectric layer 145 may be removed from those areas of wafer 101 that are not masked. These regions may be used as transistors without storage locations on the perimeter (sides and top). Additionally, an etch of the third gate stack structure of transistor 103 may be implemented to remove charge storage layer 143, dielectric layer 145, dielectric layer 133, oxide layer 129, third gate 125, dielectric layer 141, control gate dielectric 121 and charge storage layer 120. The resulting structure is a transistor having a multiple sided channel. Also, the three gate regions may have different material properties wherein some gate regions are polysilicon and other gate regions are metallic.

In one form there is provided herein a method of making a semiconductor device. A semiconductor structure is formed wherein the semiconductor structure includes a top surface, a first sidewall, and a second sidewall opposing the first sidewall. A first gate structure and a second gate structure are formed wherein the first gate structure is located adjacent to the first sidewall and the second gate structure is located adjacent to the second sidewall. A third gate structure is located over the top surface, wherein the first gate structure, the second gate structure, and the third gate structures are physically separate from each other. The first gate structure and the second gate structure are formed by depositing a layer of gate material over both the third gate structure and a substrate, and removing a portion of the layer of gate material overlying the third gate structure to form the first gate structure and the second gate structure. In another form, the first gate structure and the second gate structure are formed by non-abrasively etching the layer of gate material over the top surface of the semiconductor structure. A substantially planar layer is formed overlying the substrate below a height of a top surface of the layer of gate material. The substantially planar layer is used as a masking layer to form the first gate structure and the second gate structure. In another form the third gate structure and the semiconductor structure are formed by a single patterning step. A first dielectric material separating the semiconductor structure and the third gate structure are patterned with a single patterning step along with at least two additional layers overlying the third gate structure. A first source/drain region and a second source/drain region extending from the semiconductor structure on opposite sides of the semiconductor structure orthogonal to sides of the first gate structure and the second gate structure are formed, wherein forming the first source/drain region and the second source/drain region further includes doping the integrated circuit at locations corresponding to the first source/drain region and the second source/drain region. The first source/drain region and the second source/drain region are formed by patterning the first gate structure, the second gate structure and the third gate structure to expose the first source/drain region and the second source drain region. The first gate structure and the second gate structure are formed subsequent to forming the first source/drain region and the second source/drain region by forming a substantially planar layer overlying the substrate below a height of a top surface of the layer of gate material and using the substantially planar layer as a masking layer to form the first gate structure and the second gate structure. In one form a first dielectric layer is formed surrounding the first sidewall and the second sidewall of the semiconductor structure and electrically insulating the semiconductor structure from the first gate structure and the second gate structure. A second dielectric layer is formed overlying the top surface of the semiconductor structure with a different processing step than used to form the first dielectric layer. In one form the first dielectric layer is formed with a first dielectric material and the second dielectric layer is formed with a second dielectric material, the second dielectric material having at least one physical property that differs from the first dielectric material. In another form the at least one physical property is selected from one of dielectric layer thickness, dielectric electrical conductivity or dielectric constant. In another embodiment a charge storage structure is formed, the charge storage structure being located between the top surface and the third gate structure, wherein the charge storage structure includes nanoclusters. In one form the nanoclusters include at least one of silicon nanocrystals, germanium nanocrystals, silicon-germanium alloy nanocrystals, gold nanocrystals, silver nanocrystals, and platinum nanocrystals. In one embodiment the charge storage structure includes a charge trapping dielectric and the charge trapping dielectric includes at least one of silicon nitride, hafnium oxide, zirconium oxide, silicon rich oxide, and aluminum oxide. In one form a first charge storage structure is formed located adjacent to the first sidewall, the first gate structure located adjacent to the first charge storage structure on an opposite side of the first charge storage structure from the first sidewall. A second charge storage structure is formed located adjacent to the second sidewall, the second gate structure located adjacent to the second charge storage structure on an opposite side of the second charge storage structure from the second sidewall. In another embodiment a third charge storage structure is formed, the third charge storage structure located between the top surface and the third gate structure. In an alternative form electrical contacts are formed only to two of the first gate structure, the second gate structure and the third gate structure. In another form electrical contact is made to only one of the first gate structure, the second gate structure and the third gate structure. In one form the third gate structure to have a resultant first conductivity type. In another form the first gate structure and the second gate structure are doped to have a resultant second conductively type, the first conductively type being opposite the second conductivity type. In another form each of the first gate structure, the second gate structure and the third gate structure are doped with differing conductivities. In another embodiment the first gate structure and the second gate structure are doped by angle implanting with different doping conditions. In yet another form a semiconductor device includes a semiconductor structure having a top surface, a first sidewall, and a second sidewall opposing the first sidewall. A first gate structure is located adjacent to the first sidewall. A second gate structure is located adjacent to the second sidewall. A third gate structure is located over the top surface. In one form the first gate structure, the second gate structure and the third gate structures are physically separate from each other. A source region and a drain region extend from the semiconductor structure on opposite sides of the semiconductor structure orthogonal to sides of the first gate structure and the second gate structure. The first gate structure is located adjacent to the first sidewall at a location of the semiconductor structure between the source and the drain in one form. The second gate structure is located adjacent to the second sidewall at a location of the semiconductor structure between the source and the drain, and the third gate structure is located over the top surface between the source and drain. In another embodiment a first dielectric layer surrounds the first sidewall and the second sidewall of the semiconductor structure and electrically insulates the semiconductor structure from the first gate structure and the second gate structure. A second dielectric layer overlies the top surface of the semiconductor structure. In one form the first dielectric layer and the second dielectric layer have at least one differing physical property and the at least one differing physical property includes one of dielectric layer thickness, dielectric electrical conductivity or dielectric constant. A charge storage structure is located between the top surface and the third gate structure. In one form the charge storage structure includes nanoclusters, wherein the nanoclusters include at least one of silicon nanocrystals, germanium nanocrystals, silicon-germanium alloy nanocrystals, gold nanocrystals, silver nanocrystals, and platinum nanocrystals. In another form the charge storage structure is a charge trapping dielectric and the charge trapping dielectric includes one of silicon nitride, hafnium oxide, zirconium oxide, silicon rich oxide, and aluminum oxide. In another form a first charge storage structure is located adjacent to the first sidewall, and the first gate structure is located adjacent to the first charge storage structure on an opposite side of the first charge storage structure from the first sidewall. A second charge storage structure is located adjacent to the second sidewall, and the second gate structure is located adjacent to the second charge storage structure on an opposite side of the second charge storage structure from the second sidewall. In one embodiment the first charge storage structure and the second charge storage structure include nanoclusters, wherein the nanoclusters comprise at least one of silicon nanocrystals, germanium nanocrystals, silicon-germanium alloy nanocrystals, gold nanocrystals, silver nanocrystals, and platinum nanocrystals. The first charge storage structure and the second charge storage structure include a charge trapping dielectric wherein the charge trapping dielectric includes at least one of silicon nitride, hafnium oxide, zirconium oxide, silicon rich oxide, and aluminum oxide. A third charge storage structure is located between the top surface and the third gate structure, the third charge storage structure having at least one differing property from the first charge storage structure and the second charge storage structure. In one form the third gate structure is doped to have a first conductivity type and the first gate structure and the second gate structure are doped to have a second conductively type. In another form the first gate structure, the second gate structure and the third gate structure have differing conductivities.

Accordingly, the specification and figures are to be regarded in an illustrative rather than a restrictive sense, and all such modifications are intended to be included within the scope of the present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device comprising:
    forming a semiconductor channel structure, the semiconductor channel structure including a top horizontal surface, a first vertical sidewall, and a second vertical sidewall opposing the first sidewall;
    forming a first gate structure and a second gate structure, wherein the first gate structure is located laterally adjacent to and substantially along the first sidewall and the second gate structure is located laterally adjacent to and substantially along the second sidewall;
    forming a third gate structure located over and substantially along all of the top horizontal surface, wherein the first gate structure, the second gate structure, and the third gate structures are physically separate from each other,
    wherein forming the first gate structure and the second gate structure further comprises depositing a layer of gate material over both the third gate structure and a substrate, and removing a portion of the layer of gate material overlying the third gate structure to form the first gate structure and the second gate; and
    forming a charge storage layer between the semiconductor channel structure and at least one gate structure selected from a group consisting of the first gate structure, the second gate structure and the third gate structure.

2. The method of claim 1 further comprising:
    patterning the third gate structure after depositing the layer of gate material over both the third gate structure and the substrate.

3. The method of claim 1 wherein forming the first gate structure and the second gate structure further comprises patterning the first gate structure and the second gate structure after removing the portion of the layer of gate material overlying the third gate structure.

4. The method of claim 3 further comprising forming a substantially planar layer overlying the substrate below a height of a top surface of the layer of gate material and using the substantially planar layer as a masking layer to form the first gate structure and the second gate structure.

5. A method of making a semiconductor device comprising:
    forming a semiconductor channel structure, wherein the semiconductor channel structure is formed from a layer of semiconductor material, the semiconductor channel structure including a top surface, a first sidewall, and a second sidewall opposing the first sidewall;
    forming a first gate structure and a second gate structure, wherein the first gate structure is located laterally adjacent to and substantially along the first sidewall and the second gate structure is located laterally adjacent to and substantially along the second sidewall;
    forming a third gate structure located over and substantially along all of the top surface, wherein the first gate structure, the second gate structure, and the third gate structures are physically separate from each other,
    wherein forming the third gate structure includes forming a layer of gate material over the semiconductor material and patterning the layer of gate material and layer of semiconductor material with a single patterning step; and forming a charge storage layer between the semiconductor channel structure and at least one gate structure selected from a group consisting of the first gate structure, the second gate structure and the third gate structure.

6. The method of claim 5 further comprises patterning a first dielectric material separating the semiconductor channel structure and the third gate structure and at least two additional layers overlying the third gate structure with the single patterning step.

7. The method of claim 1 further comprising:
forming a first source/drain region and a second source/drain region extending from the semiconductor channel structure on opposite sides of the semiconductor channel structure orthogonal to sides of the first gate structure and the second gate structure, wherein forming the first source/drain region and the second source/drain region further includes doping the integrated circuit at locations corresponding to the first source/drain region arid the second source/drain region.

8. The method of claim 7 further comprising forming the first source/drain region and the second source/drain region by patterning the first gate structure, the second gate structure and the third gate structure to expose the first source/drain region and the second source drain region.

9. The method of claim 7 further comprising forming the first gate structure and the second gate structure subsequent to forming the first source/drain region and the second source/drain region by forming a substantially planar layer overlying the substrate below a height of a top surface of the layer of gate material and using the substantially planar layer as a masking layer to form the first gate structure and the second gate structure.

10. The method of claim 1 further comprising:
forming a first dielectric layer surrounding the first sidewall and the second sidewall of the semiconductor channel structure and electrically insulating the semiconductor channel structure from the first gate structure and the second gate structure; and
forming a second dielectric layer overlying the top surface of the semiconductor channel structure with a different processing step than used to form the first dielectric layer.

11. The method of claim 10 further comprising forming the first dielectric layer with a first dielectric material and forming the second dielectric layer with a second dielectric material, the second dielectric material comprising at least one physical property that differs from the first dielectric material.

12. The method of claim 11 further comprising selecting the at least one physical property from one of dielectric layer thickness, dielectric electrical conductivity or dielectric constant.

13. The method of claim 1 wherein the charge storage structure includes nanoclusters.

14. The method of claim 1 wherein the nanoclusters include at least one of silicon nanocrystals, germanium nanocrystals, silicon-germanium alloy nanocrystals, gold nanocrystals, silver nanocrystals, and platinum nanocrystals.

15. The method of claim 1 wherein the charge storage structure includes a charge trapping dielectric.

16. The method of claim 15 wherein the charge trapping dielectric includes at least one of silicon nitride, hafnium oxide, zirconium oxide, silicon rich oxide, and aluminum oxide.

17. The method of claim 1 further comprising:
forming a first charge storage structure located adjacent to the first sidewall, the first gate structure located adjacent to the first charge storage structure on an opposite side of the first charge storage structure from the first sidewall;
forming a second charge storage structure located adjacent to the second sidewall, the second gate structure located adjacent to the second charge storage structure on an opposite side of the second charge storage structure from the second sidewall.

18. The method of claim 17 further comprising:
forming a third charge storage structure, the third charge storage structure located between the top surface and the third gate structure.

19. The method of claim 1 further comprising:
forming electrical contacts only to two of the first gate structure, the second gate structure and the third gate structure.

20. The method of claim 1 further comprising:
forming electrical contact to only one of the first gate structure, the second gate structure or the third gate structure.

21. The method of claim 1 further comprising:
doping the third gate structure to have a resultant first conductivity type;
doping the first gate structure and the second gate structure to have a resultant second conductively type, the first conductively type being opposite the second conductivity type.

22. The method of claim 1 further comprising:
doping each of the flint gate structure, the second gate structure and the third gate structure with differing conductivities.

23. The method of claim 1 wherein doping the first gate structure and the second gate structure further comprises angle implanting with different doping conditions.

24. A semiconductor device comprising:
a semiconductor structure including a top surface, a first sidewall, and a second sidewall opposing the first sidewall;
a first gate structure located adjacent to the first sidewall;
a second gate structure located adjacent to the second sidewall;
a third gate structure located over the top surface; and
a first charge storage structure located between the top surface and the third gate structure;
wherein first gate structure, the second gate structure and the third gate structures are physically separate from each other.

25. The semiconductor device of claim 24 further comprising:
a source region and a drain region extending from the semiconductor structure on opposite sides of the semiconductor structure orthogonal to sides of the first gate structure and the second gate structure;
wherein the first gate structure is located adjacent to the first sidewall at a location of the semiconductor structure between the source and the drain;
wherein the second gate structure is located adjacent to the second sidewall at a location of the semiconductor structure between the source and the drain; and wherein the third gate structure is located over the top surface between the source and drain.

26. The semiconductor device of claim 24 further comprising:
a first dielectric layer surrounding the first sidewall and the second sidewall of the semiconductor structure and electrically insulating the semiconductor structure from the first gate structure and the second gate structure; and
a second dielectric layer overlying the top surface of the semiconductor structure, the first dielectric layer and the second dielectric layer comprising at least one differing physical property.

27. The semiconductor device of claim 26 wherein the at least one differing physical property comprising one of dielectric layer thickness, dielectric electrical conductivity or dielectric constant.

28. The semiconductor device of claim 24 wherein the first charge storage structure includes nanoclusters, wherein the nanoclusters include at least one of silicon nanocrystals, germanium nanocrystals, silicon-germanium alloy nanocrystals, gold nanocrystals, silver nanocrystals, and platinum nanocrystals.

29. The semiconductor device of claim 24 wherein the first charge storage structure comprises a charge trapping dielectric.

30. The semiconductor device of claim 29 wherein the charge trapping dielectric comprises at least one of silicon nitride, hafnium oxide, zirconium oxide, silicon rich oxide, and aluminum oxide.

31. The semiconductor device of claim 24 further comprising:
a second charge storage structure located adjacent to the first sidewall, the first gate structure located adjacent to the second charge storage structure on an opposite side of the second charge storage structure from the first sidewall; and
a third charge storage structure located adjacent to the second sidewall, the second gate structure located adjacent to the third charge storage structure on an opposite side of the third charge storage structure from the second sidewall.

32. The semiconductor device of claim 31 wherein the second charge storage structure and the third charge storage structure include nanoclusters, wherein the nanoclusters comprise at least one of silicon nanocrystals, germanium nanocrystals, silicon-germanium alloy nanocrystals, gold nanocrystals, silver nanocrystals, and platinum nanocrystals.

33. The semiconductor device of claim 31 wherein the second charge storage structure and the third charge storage structure include a charge trapping dielectric wherein the charge trapping dielectric comprises at least one of silicon nitride, hafnium oxide, zirconium oxide, silicon rich oxide, and aluminum oxide.

34. The semiconductor device of claim 31 wherein the first charge storage structure has at least one differing property from the second charge storage structure and the third charge storage structure.

35. The semiconductor device of claim 24 wherein:
the third gate structure is doped to have a first conductivity type; and
the first gate structure and the second gate structure are doped to have a second conductively type.

36. The semiconductor device of claim 24 wherein the first gate structure, the second gate structure and the third gate structure have differing conductivities.

37. The method of claim 1 wherein forming the first gate structure and the second gate structure further comprises non-abrasively etching the layer of gate material over the top surface of the semiconductor channel structure.

* * * * *